United States Patent
Shimazu et al.

(10) Patent No.: US 6,444,374 B1
(45) Date of Patent: Sep. 3, 2002

(54) MANUFACTURING METHOD OF MASK FOR ELECTRON BEAM PROXIMITY EXPOSURE AND MASK

(75) Inventors: Nobuo Shimazu, Machida (JP); Takao Utsumi, Watchung, NJ (US)

(73) Assignee: LEEPL Corporatin, Tokyo (JP)

( * ) Notice: Subject to any disclaimer, the term of this patent is extended or adjusted under 35 U.S.C. 154(b) by 0 days.

(21) Appl. No.: 09/732,931

(22) Filed: Dec. 11, 2000

(51) Int. Cl.$^7$ ................................................. G03F 9/00
(52) U.S. Cl. .............................. 430/5; 430/30; 430/296; 430/942; 382/144
(58) Field of Search ............................... 430/5, 30, 296, 430/942; 382/144

(56) References Cited

U.S. PATENT DOCUMENTS 5,831,272 A    11/1998  Utsumi ..................... 250/492.2
6,284,415 B1 *  9/2001  Nakasuji ..................... 430/296

OTHER PUBLICATIONS

High Throughput Submicron Lithography With Electron Beam Proximity Printing, H. Bohlen Et Al., Solid State Technology, Sep. 1984, pp. 210–217.

Low Energy Electron–Beam Proximity Projection Lithography: Discover of Missing Link, Takao Utsumi, J. Vac. Sci. Technol. B 17(6), Nov./Dec. 1999, pp. 2897–2902.

* cited by examiner

*Primary Examiner*—Christopher G. Young
(74) *Attorney, Agent, or Firm*—Nixon Peabody LLP; David S. Safran

(57) ABSTRACT

A method for manufacturing a mask which is used in an electron beam proximity exposure apparatus comprising an electron beam source which emits a collimated electron beam, the mask having an aperture which is arranged on a path of the electron beam, and a stage which holds and moves an object, wherein the mask is arranged in proximity to a surface of the object and a pattern corresponding to the aperture of the mask is exposed on the surface of the object with the electron beam having passed through the aperture, the method comprises the steps of: dividing the mask into a plurality of partial areas, and forming a plurality of partial masks which have apertures with patterns identical with the plurality of partial areas, respectively; and manufacturing the mask by exposing the patterns of the plurality of partial masks on corresponding positions of a mask substrate in an electron beam proximity exposure method. Thus, the method of manufacturing the masks for the electron beam proximity exposure at reduced costs is accomplished.

12 Claims, 11 Drawing Sheets

FIG. 8
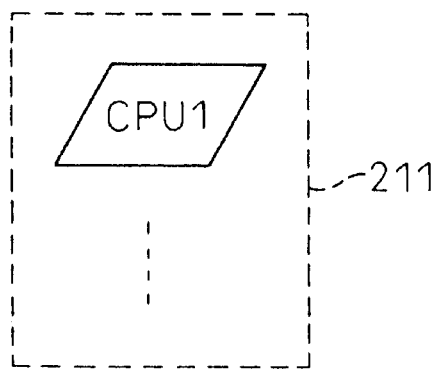
CPU MASK GROUP
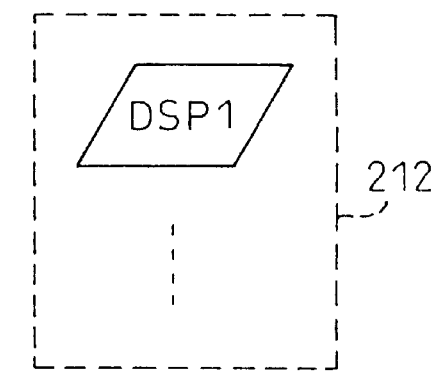
DSP MASK GROUP
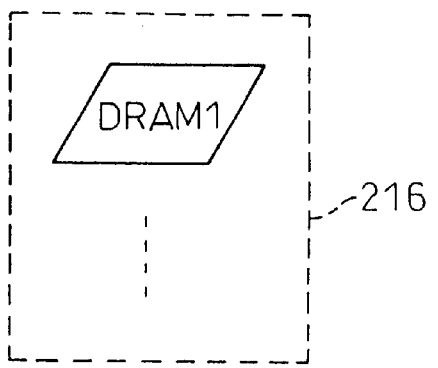
DRAM MASK GROUP
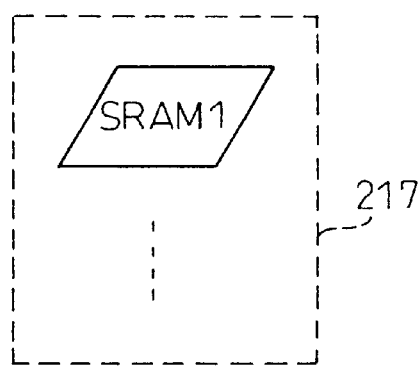
SRAM MASK GROUP
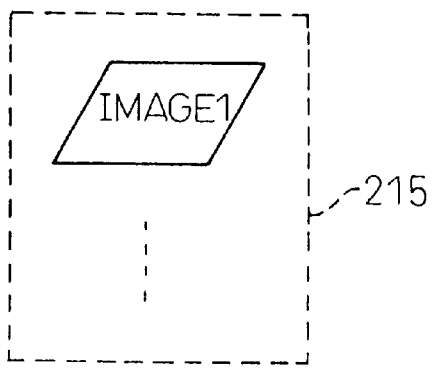
IMAGE PROCESSING MASK GROUP
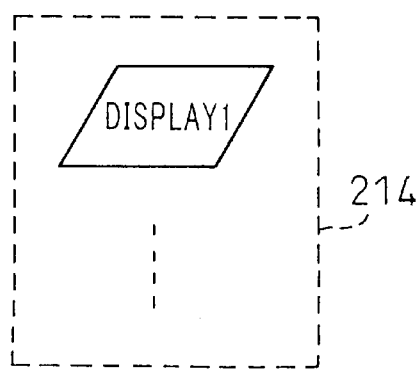
DISPLAY CONTROLLER MASK GROUP

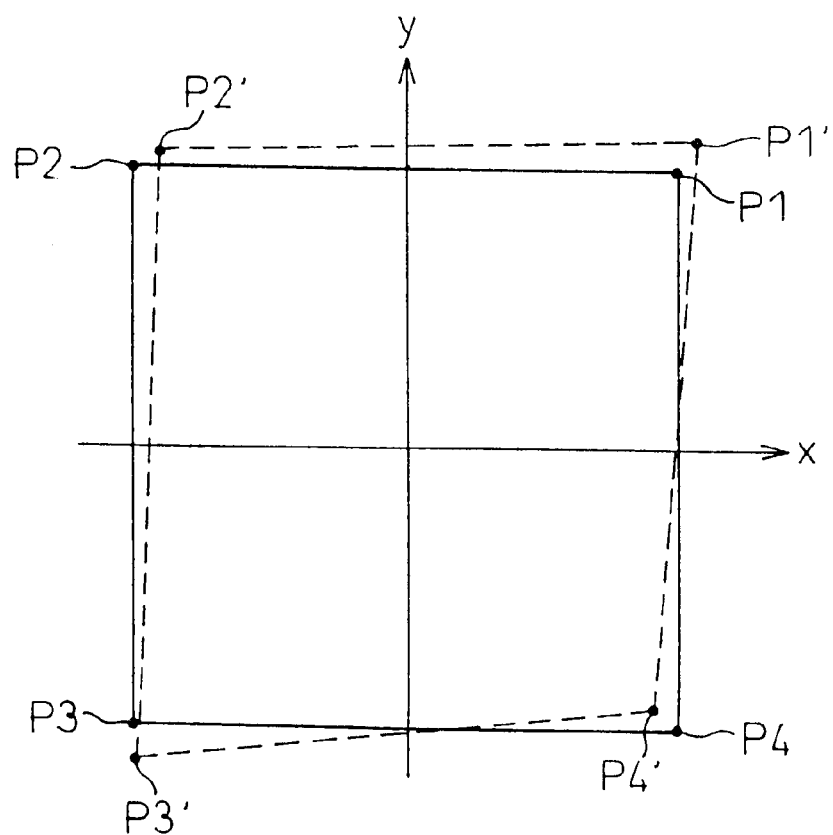
F I G. 12

MANUFACTURING METHOD OF MASK FOR ELECTRON BEAM PROXIMITY EXPOSURE AND MASK

BACKGROUND OF THE INVENTION

1. Field of the Invention

The present invention relates to a manufacturing method of a mask for an exposure apparatus used to expose fine patterns in a manufacturing process of semiconductor integrated circuits, etc., and more particularly to a manufacturing method of a mask used in an electron beam proximity exposure apparatus in which the mask having apertures corresponding to a pattern to be exposed is disposed in proximity to a surface of an object such as a semiconductor wafer, the mask is irradiated with an electron beam, and exposure of the pattern with the electron beam having passed through the apertures is thereby performed.

2. Description of the Related Art

Attempts are being made to enhance integration degrees of semiconductor integrated circuits and finer circuit patterns are desired. Presently, a limit of the finer circuit patterns is defined mainly by exposure apparatuses, and a stepper, which is an optical exposure apparatus, takes various measures such as a light source that emits rays having shorter wavelengths, a larger NA (numerical aperture) and a phase shift method. However, much finer circuit patterns involve various kinds of problems such as a rapid increase of production costs. New types of exposure apparatus such as an electron beam direct lithography apparatus and an X-ray exposure apparatus have been therefore developed, but there still remain many problems in terms of stability, productivity, cost, etc.

An electron beam proximity exposure system is conventionally under research and development, since the exposure principle thereof is simple, as "High Throughput Submicron Lithography with Electron Beam Proximity Printing" (H. Bohlen et al., Solid State Technology, September 1984, pp. 210–217) (hereinafter referred to as literature 1) exemplifies. However, it was thought that it was of no practical use since it was difficult to eliminate the proximity effect peculiar to the electron beam.

U.S. Pat. No. 5,831,272 (corresponding to Japanese Patent No. 2951947) and "Low energy electron-beam proximity projection lithography: Discovery of missing link" (Takao Utsumi, J. Vac. Sci. Technol. B 17(6), November/December 1999, pp. 2897–2902) disclose an electron beam proximity exposure apparatus that overcomes the above-mentioned problems and is usable for processing with very fine resolution at a mass production level.

FIG. 1 is a view showing a fundamental configuration to realize the electron beam proximity exposure apparatus disclosed in U.S. Pat. No. 5,831,272. Referring to this drawing, the electron beam proximity exposure apparatus disclosed in U.S. Pat. No. 5,831,272 will be briefly described. As shown in FIG. 1, in a column 10 are disposed an electron gun 12, which includes an electron beam source 14 emitting an electron beam 15, a shaping aperture 16, and a condenser lens 18 collimating the electron beam 15; scanning means 20, which includes a pair of main deflecting devices 22 and 24 and scans with the electron beam parallel to the optical axis; an object mask (hereinafter simply referred to as a mask) 30, which has apertures corresponding to an exposed pattern; and an object (a semiconductor wafer) 40, of which surface is coated with a resist layer. The mask 30 has a film 32 with the apertures formed at the center within a thick rim 34, and the object 40 is disposed so that the surface thereof is in proximity to the mask 30. In this state, when the electron beam is vertically applied to the mask, the electron beam passing through the mask's apertures is applied to the resist layer 42 on the surface of the object 40. The entire surface of the film 32 on the mask 30 is scanned by deflecting the electron beam 15 (A, B, and C in FIG. 1 denote the deflected beam toward three points) with the scanning means 20, so that all aperture patterns of the mask 30 are exposed. The scanning means 20 has subsidiary deflecting devices 51 and 52, which slightly lean the electron beam, and is used to position the mask 30 and the object 40 and to correct a difference between the exposure positions due to distortion of the mask and distortion of the object.

The mask for an electron beam proximity exposure apparatus must not have any defect. Accordingly, prior to be used, a manufactured mask is inspected whether it has no defect. Although a correction device corrects defects if any, some of the defects are uncorrectable. If the mask has the uncorrectable defects, it is required to dispose of the mask and to form a new mask without defect.

Variety kinds of factors cause defects of the mask, and the major one of the factors is contamination with dust (particles). On the same manufacturing conditions, an incidence of the defect caused by dust is in proportion to the area of the mask. Therefore, manufacture of bigger masks involves a higher incidence of the defect.

The mask for the electron beam proximity exposure is manufactured by exposing the pattern by a conventional electron beam exposure apparatus that can expose desired patterns. Such an apparatus takes an extremely long time for exposing patterns with high quality, and the costs of the masks are thereby increased. As described above, if the mask has the uncorrectable defects, it is required to dispose of the mask and to expose a new mask for a long time until a defectless mask is obtained. It produces a problem in that the production costs of masks are even increased.

SUMMARY OF THE INVENTION

The present invention has been developed in view of the above-described circumstances, and has as its object the provision of a method for manufacturing masks for the electron beam proximity exposure at reduced costs.

The inventors of the present invention have directed their attention to the features that the electron beam proximity exposure apparatus is an actual-size exposure apparatus, an exposed pattern is identical with a pattern of the mask, and the electron beam proximity exposure apparatus can be used to copy the masks.

The method for manufacturing a mask for the electron beam proximity exposure according to the present invention is characterized in method for manufacturing a mask which is used in an electron beam proximity exposure apparatus comprising an electron beam source which emits a collimated electron beam, the mask having an aperture which is arranged on a path of the electron beam, and a stage which holds and moves an object, wherein the mask is arranged in proximity to a surface of the object and a pattern corresponding to the aperture of the mask is exposed on the surface of the object with the electron beam having passed through the aperture, the method comprising the steps of: dividing the mask into a plurality of partial areas, and forming a plurality of partial masks which have apertures with patterns identical with the plurality of partial areas, respectively; and manufacturing the mask by exposing the patterns of the plurality of partial masks on corresponding positions of a mask substrate in an electron beam proximity exposure method.

The patterns of the partial masks should be exposed at predetermined positions with respect to each other, and it is preferable that each of the plurality of partial masks has a positioning mark.

As described in the above, the mask for the electron beam proximity exposure is a very thin film, which is required to have an excellent flatness. Then, it is necessary to form a thin film on the surface of the film to apply a force in the direction of it shrinking so that a stress to tense the thin film portion is applied from the thick portion around the mask. However, the film for stressing causes a very small distortion on the aperture pattern, which results in a difference between the actual aperture pattern and a desired pattern.

As disclosed in U.S. Pat. No. 5,831,272, etc., the electron beam proximity exposure apparatus can correct a small distortion of the mask by adjusting a direction of the electron beam applied to the mask. Then, after the manufacturing of the partial mask, it is preferable to measure an amount of distortion of the pattern thereof, and to perform the exposure of the mask while correcting the amount of the distortion.

Since the partial masks are masks of areas into which a mask of size of one chip is divided, they are smaller than the mask of size of one chip. Accordingly, if a substrate on which the mask of size of one chip can be formed or a bigger substrate is used as a partial mask substrate, a plurality of partial masks can be formed separately from each other. For example, the partial mask substrate big enough to arrange all partial masks separately from each other is used, so that all partial masks are separately formed on a single partial mask substrate. If no uncorrectable defect is detected in all partial masks on inspection, a pattern of one mask is exposed by using only the partial mask substrate when a moving mechanism for the partial mask substrate is provided on the electron beam proximity exposure apparatus. In this case, it is unnecessary to take the partial mask substrate out the apparatus to replace it while exposing the pattern of one mask, so that it can reduce a time for performing the exposure.

If one or more of the partial masks has an uncorrectable defect, partial masks concerning the uncorrectable defect are formed as many as possible on the second partial mask substrate. For example, when the partial mask substrates on each of which sixteen partial masks can be formed are used, and if there are four pieces of the partial mask with uncorrectable detects on the first partial mask substrate, four pieces of the partial mask each corresponding to each of the partial masks with the uncorrectable defects can be formed on the second partial mask substrate. On account of a low incidence of uncorrectable defects on all the four partial masks, all patterns of the mask are generally exposed by using the two pieces of the partial mask substrates.

The use of the partial mask substrate that can have more partial masks so as to form a plurality of pieces of each the partial mask on a single partial mask substrate improves a chance of providing a complete set of defectless partial masks on the single partial mask substrate.

BRIEF DESCRIPTION OF THE DRAWINGS

The nature of this invention, as well as other objects and advantages thereof, will be explained in the following with reference to the accompanying drawings, in which like reference characters designate the same or similar parts throughout the figures and wherein:

FIG. 8 is a diagram illustrating mask groups provided in the third embodiment of the present invention;

FIG. 12 is a diagram illustrating a correction of distortion produced on the partial mask.

DETAILED DESCRIPTION OF THE PREFERRED EMBODIMENTS

Figure 2:
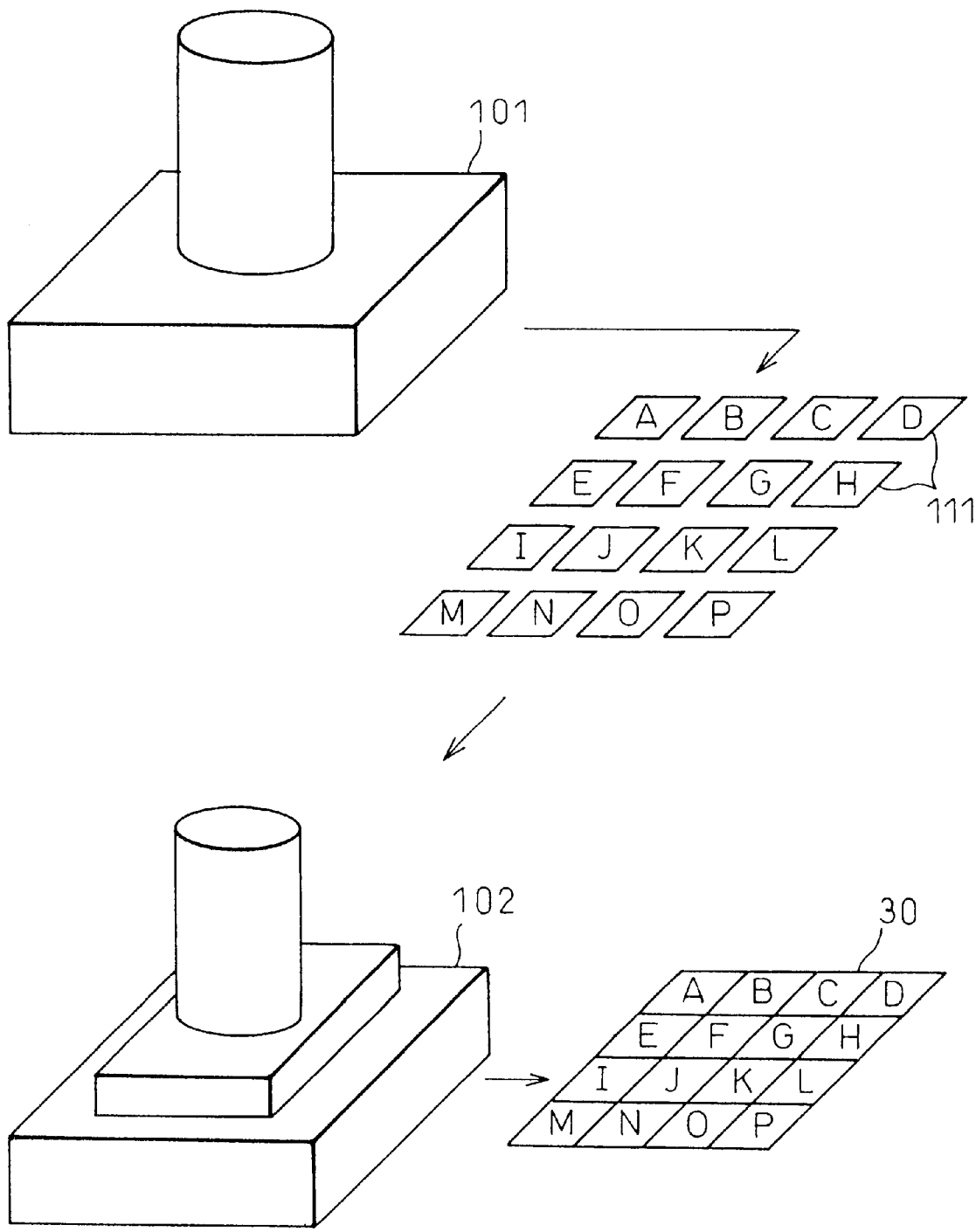
FIG. 2 is a diagram illustrating a fundamental concept according to the present invention.

FIG. 2 is a diagram illustrating a fundamental concept according to the present invention.

As described in FIG. 2, a mask 30 over an entire surface of one chip (die), which is required after all, is divided into a plurality of partial areas A–P. Then, each of the partial areas A–P is exposed by using a conventional electron beam exposure apparatus 101 that can expose desired patterns, and partial masks 111 respectively corresponding to the partial areas A–P are formed. Each of the formed partial masks 111 is inspected. If a correctable defect is detected, it is then corrected. If an uncorrectable defect is detected, only the partial mask that has the uncorrectable defect is re-formed. Thus, the partial masks 111 that have no defect and respectively correspond to all the partial areas A–P are formed. For instance, when the partial areas are sixteen parts identical in size, and when only one of them has an uncorrectable defect, a time for exposing the one partial mask again is estimated to be substantially $1/16$ (a real exposure time is determined with substantial patterns) of a time for exposing the whole mask 30 or all the partial areas A–P.

Next, the defectless partial masks 111 corresponding to the partial areas A–P are exposed at corresponding positions, respectively, by an electron beam proximity exposure apparatus 102 having a configuration similar to the configuration disclosed in U.S. Pat. No. 5,831,272, so that the mask 30 is formed. A Time for exposing all the partial masks 111 corresponding to the partial areas A–P is between thousandths and $1/10000$ of a time for exposing the whole mask 30 by the conventional electron beam exposure apparatus 101.

The thus formed mask 30 is inspected. If an uncorrectable defect is detected, the partial masks 111 corresponding to the partial areas A–P are exposed at corresponding positions, respectively, by the electron beam proximity exposure apparatus 102 so that the mask 30 is re-formed. This procedure is repeated until the mask 30 without defect is obtained. In this case, an incidence of the defect caused by dust may not be different between such case that the conventional electron beam exposure apparatus 101 is used for the exposure of the whole mask 30 and such case that the electron beam proximity exposure apparatus 102 is used for the exposure of the plurality of partial masks 111. However, since the time for the exposure by the electron beam proximity exposure apparatus 102 is far shorter, the time for processing that is repeated until the defectless mask 30 is obtained is far shortened. The production costs of the masks are thus significantly reduced.

Figure 3:
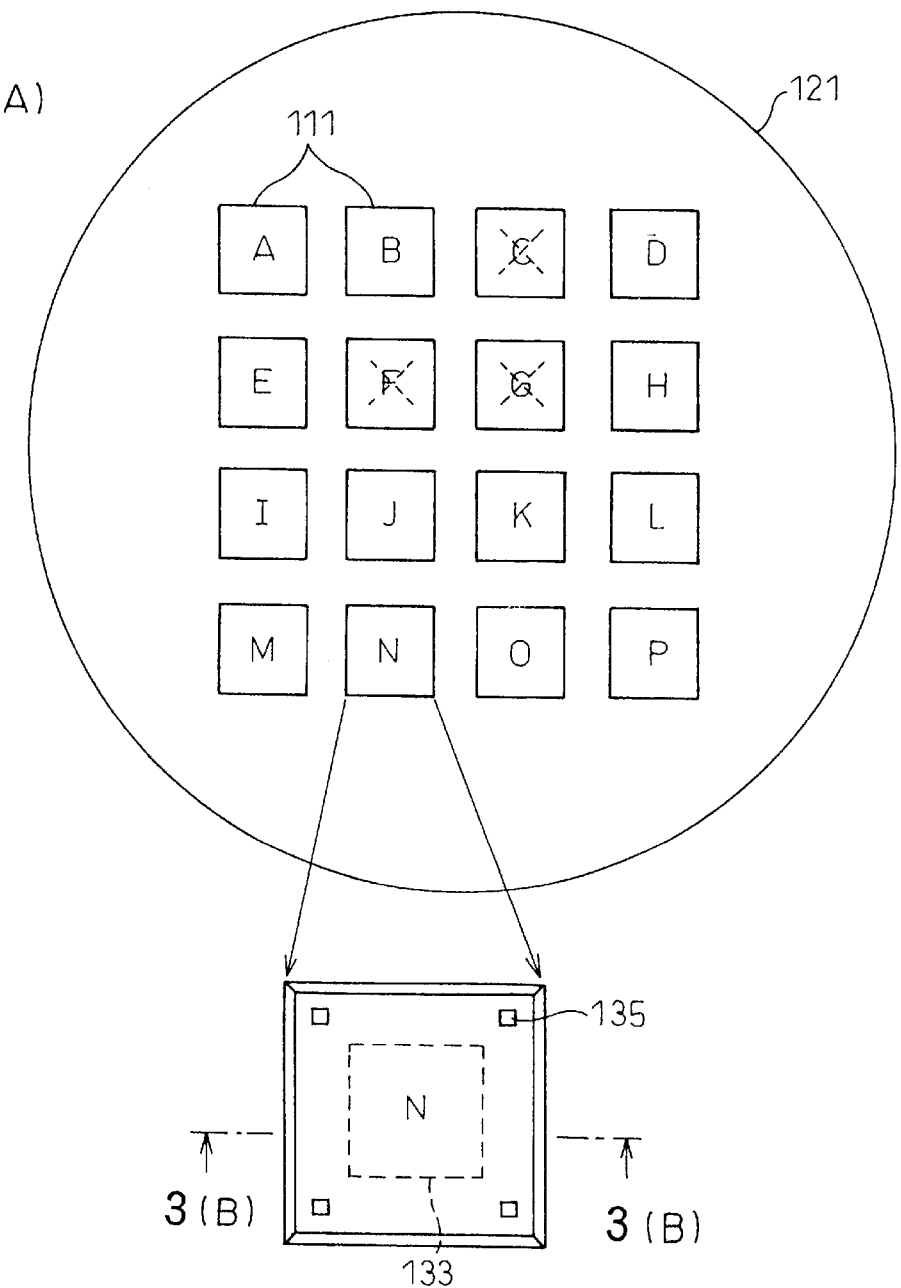
FIG. 3(A) is a view showing an arrangement of partial masks on a partial mask substrate in addition to each shape of partial masks according to a first embodiment of the present invention.
FIG. 3(B) is a sectional view taken along line 3(B)—3(B) in FIG. 3(A)
Figure 3:
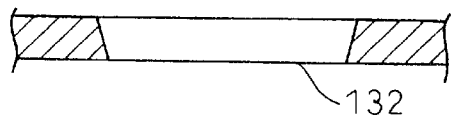

According to the first embodiment of the present invention, a pattern of one mask is divided into sixteen partial areas A–P as shown in FIG. 2, and the sixteen partial masks respectively having the patterns of the partial areas A–P are formed. According to the first embodiment, a partial mask substrate is used on which the sixteen partial masks can be formed to have some distances away from each other. FIG. 3(A) is a view showing an example of an arrangement of the sixteen partial masks 111 on the partial mask substrate 121, and FIG. 3(B) is a sectional view taken along line 3(B)—3(B) in FIG. 3(A); where the partial masks corresponding to the partial areas A–P are denoted with A–P. The partial mask substrate 121 is, for example, a thin plate (wafer) with a thickness of a few millimeters. In each of the partial masks 111, a portion denoted with a reference number 132 is processed in the thickness of a few micrometers or submicrometers, in which an aperture pattern is formed at a portion denoted with a reference number 133. A reference number 135 denotes a mark for determining the position of the mask. When the partial mask substrate is processed, the patterns of the partial masks A–P are exposed to have some distances away from each other as illustrated, by the conventional electron beam exposure apparatus 101 on a resist layer formed on a side of the partial mask substrate 121. Then, the resist layer is developed and the side of the partial mask substrate 121 is etched to form holes at aperture parts of the pattern. The holes are made deeper than a thickness of the portion denoted with the reference number 132. At this point, holes corresponding to a pattern of the marks 135 are also formed.

Next, a resist layer is formed on the other side of the partial mask substrate 121, and the resist layer at the portions denoted with the reference number 132 of the masks is removed by lithography. That is, the resist layer is formed except for the portions denoted with the reference number 132. Then, the other side of the partial mask substrate 121 is etched so as to process to the thickness of a few micrometers. Thereby, the holes formed on the side are perforated, so that the aperture pattern is formed. The sixteen partial masks are thus formed on the partial mask substrate 121. Each of the partial masks on the partial mask substrate 121 is inspected, correctable defects are then corrected, and useable partial masks are selected. For example, as shown in FIG. 3(A), C, F and G of the sixteen partial masks have uncorrectable defects.

Figure 4:
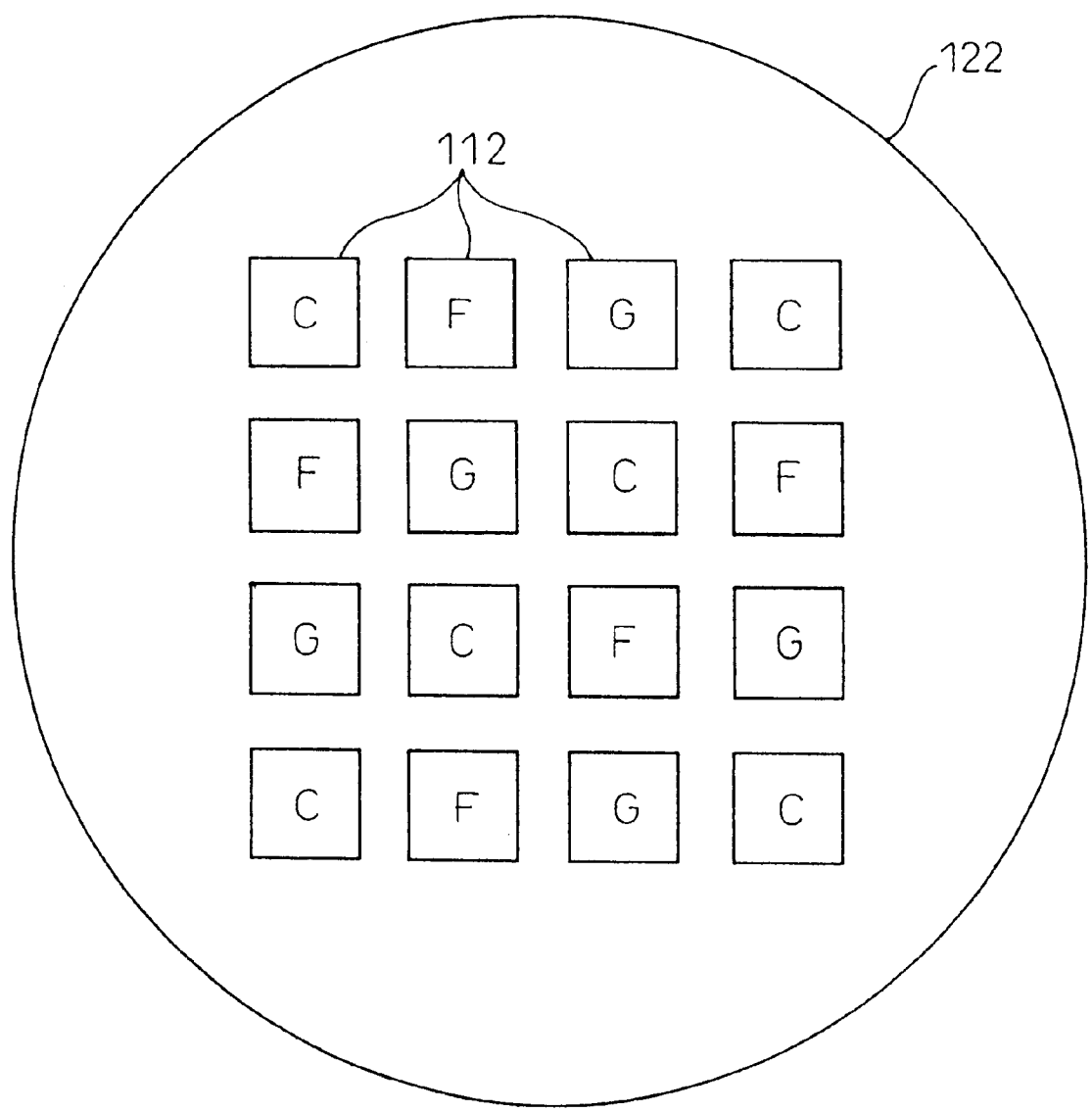
FIG. 4 is a view showing partial masks formed on the second partial mask substrate when the partial masks formed on the first partial mask substrate have defects according to the first embodiment.

Next, as illustrated in FIG. 4, partial masks of C, F and G are formed on the second partial mask substrate 122. Since sixteen partial masks can be formed on the second partial mask substrate 122 as the first partial mask substrate 121 in FIG. 3, six pieces of the partial mask C, five pieces of the partial mask F and five pieces of the partial mask G are formed. The partial masks C, F, and G on the second partial mask substrate 122 are inspected to select useable partial masks. At least one useable mask is sufficient for each of the partial masks C, F and G. If one of the partial masks C, F, and G does not have any useable mask yet, only partial masks corresponding to the one partial mask are formed on another partial mask substrate. For instance, when each of the partial masks C and G has the useable partial mask and all of five pieces of the partial mask F have uncorrectable defects, sixteen pieces of the partial mask F are formed on another partial mask substrate. Thus, the above-described process is repeated until at least one partial mask without defect is obtained as for each of the partial masks A–P.

At this point, since six pieces of the partial mask C are formed on the partial mask substrate 122, a possibility that all of the six pieces of the partial masks C have uncorrectable defects is lowered. This applies to also the partial masks F and G.

The patterns of the partial masks A–P are exposed at the corresponding positions on the substrate 31 of the mask 30 by using the defectless partial masks A–P, which are formed as described above, in the electron beam proximity exposure apparatus 102, so that the mask 30 is formed in the same method as described above. This exposure is accomplished in a short time, since it is performed by merely scanning the partial masks A–P to expose with the electron beam after positioning them with respect to the substrate 31 of the mask 30. In a case where the first partial mask substrate 121 has an unusable partial mask and partial masks are also formed on the second partial mask substrate, after the exposure of the normal partial masks on the first partial mask substrate 121 is completed, the second partial mask substrate is mounted and the exposure of the remaining partial mask is performed. At this point, the second partial mask substrate may be set after the first partial mask substrate is taken out of the electron beam proximity exposure apparatus 102; however, it is preferable that a moving mechanism for the partial mask substrate is provided within the electron beam proximity exposure apparatus so that the partial mask substrates to use can be changed.

The thus formed mask 30 is inspected. If an uncorrectable defect is detected, the mask 30 is formed again. This procedure is repeated until the mask 30 without defect is obtained. Since each exposure time is short, the total exposure time does not become long, even though the procedure is repeated until the mask 30 is obtained.

The conventional electron beam exposure apparatus is extremely expensive, and the production costs of masks mainly depends on a time for using it. According to the present invention, a time for using the extremely expensive and conventional electron beam exposure apparatus is significantly shortened, and the production costs of masks are thus reduced. Moreover, the electron beam proximity exposure apparatus is far less complicated and less expensive than the conventional electron beam exposure apparatus. Therefore, since the costs of use of the electron beam proximity exposure apparatus are small and the using time is short, such amount of the costs do not augment the production costs.

The mask for the electron beam proximity exposure comprises an extremely thin film with its thickness of a few micrometers or submicrometers, and the film is required to have an excellent flatness. Then, a stressing film is formed on the surface of the film of the mask to apply a stress to tense the film portion from a thick portion around the mask, and the excellent flatness is thus achieved. However, the film has apertures of which pattern is partially different, so that the contracting force of the stressing film is partially varied and it causes distortion on the film of the mask. The above-described literature 1 and U.S. Pat. No. 5,831,272 disclose a technique in the electron beam proximity exposure apparatus to correct the distortion on the mask by changing a direction of the electron beam applied to the mask. In the first embodiment, this technique is utilized to reduce the distortion as described below when the pattern of the partial mask is exposed.

Figure 1:
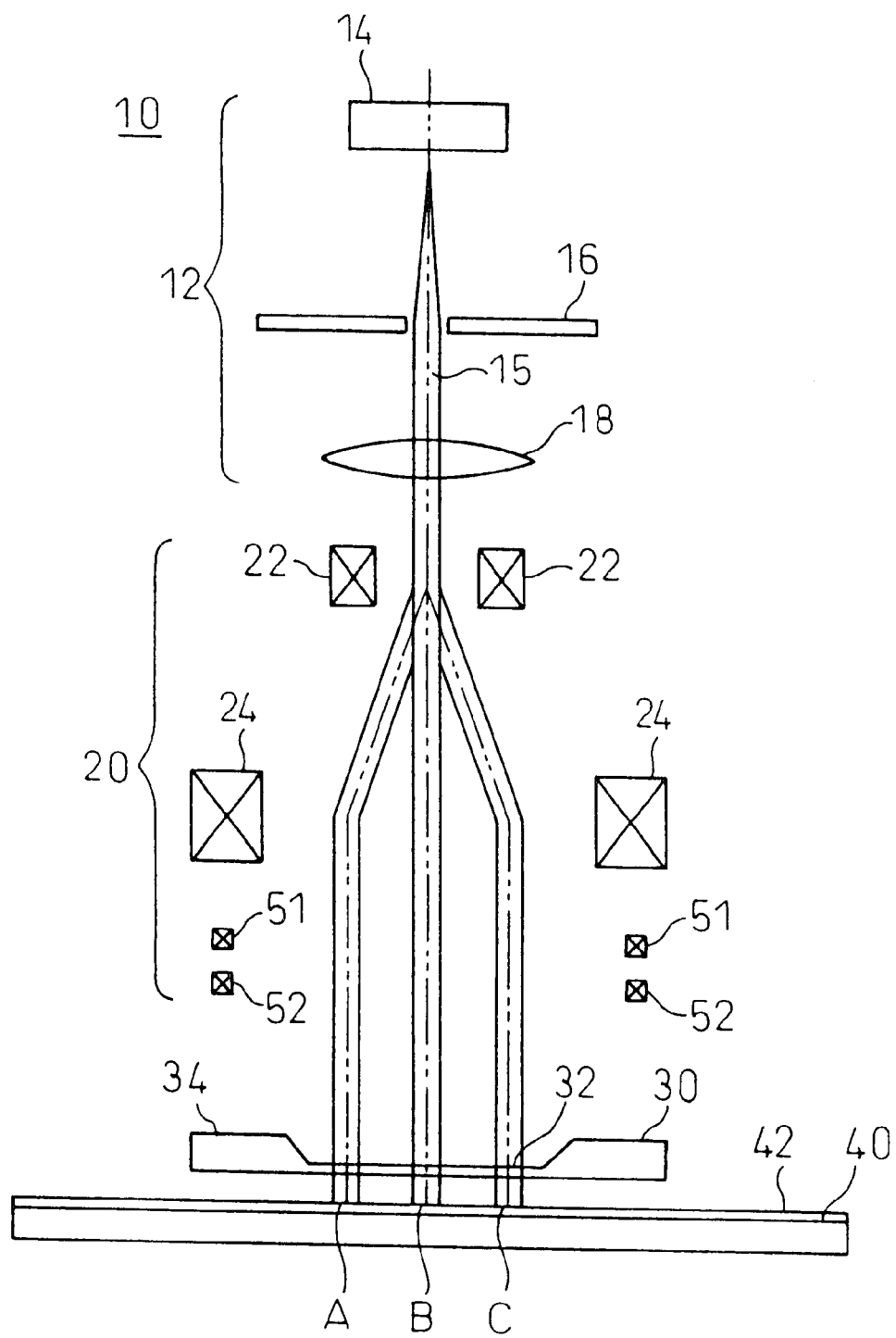
FIG. 1 is a view showing a fundamental configuration of an electron beam proximity exposure apparatus.
Figure 10:
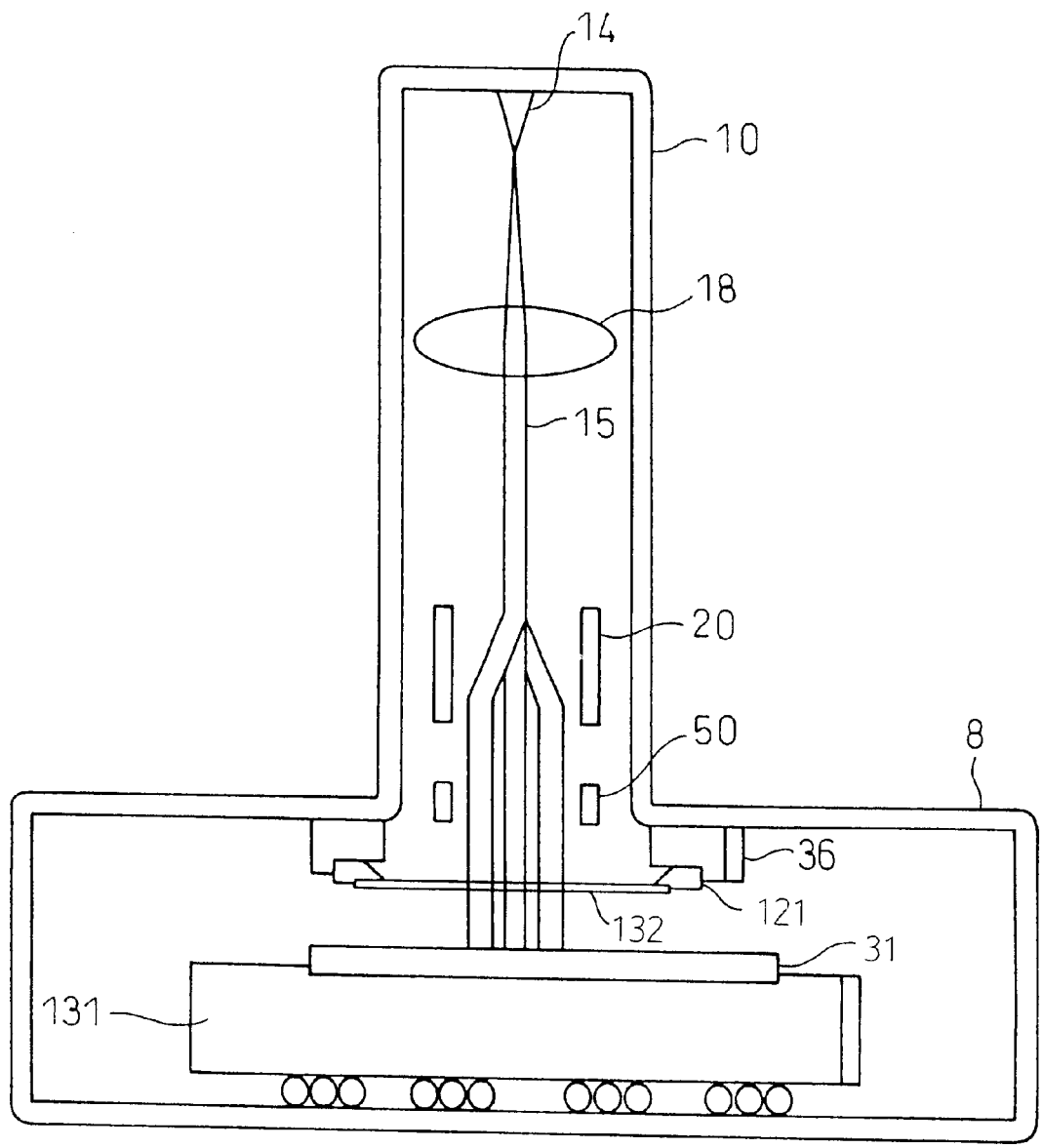
FIG. 10 is a view showing a configuration of the electron beam proximity exposure apparatus used in the embodiments of the present invention.

FIG. 10 is a view showing a configuration of an electron beam proximity exposure apparatus 102 used in the embodiment of the present invention. Since the fundamental configuration is similar to the one shown in FIG. 1 and the one disclosed in the above literature 1, the same function parts with FIG. 1 are denoted with the same reference numbers.

As shown in FIG. 10, in an electron optical column 10 are disposed an electron gun 14, which emits electron beam 15, a condenser lens 18, which collimates the electron beam 15, a main deflecting device 20 and a subsidiary deflecting device 50. Although shown as a single deflecting device in FIG. 10, each of the main deflecting device 20 and the subsidiary deflecting device 50 is actually configured in two stages as shown in FIG. 1. In a vacuum object chamber 8 are disposed a mask stage 36, which holds and moves a mask (the partial mask substrate 121 (or 122) in the present embodiment), and a stage 131, which holds and moves an object (the substrate 31 of the mask 30 in the present embodiment).

In FIG. 10, a state is shown where an applied position of the electron beam 15 on the partial mask substrate 121 is changed by the main deflecting device 20. As illustrated, even when the main deflecting device 20 changes the applied position, the electron beam 15 is substantially vertically applied to the partial mask substrate 121.

Figure 11:
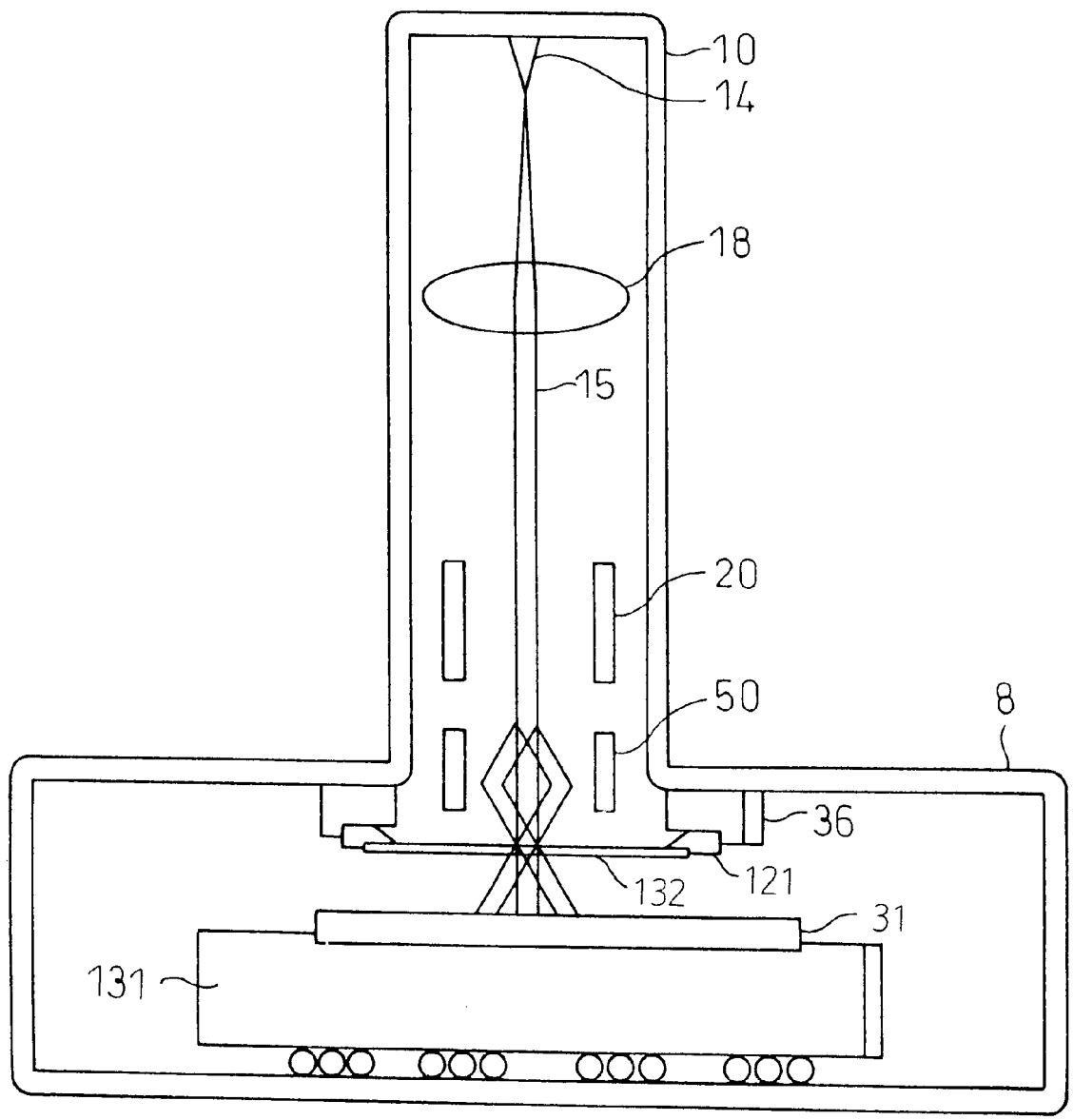
FIG. 11 is a view illustrating a method of exposing while correcting a distortion of the partial mask in the electron beam proximity exposure apparatus.

In contrast, as shown in FIG. 11, when the subsidiary deflecting device 50 changes an incident angle of the electron beam 15 onto the partial mask substrate 121, the electron beam 15 falls on the same position on the partial mask substrate 121 while the incident angle is changed. As the incident angle is changed, the applied position on the substrate 31 of the mask 30 is changed in spite of the electron beam having passed through the same position of the mask. The changing amount is a product of the incident angle and the distance between the partial mask substrate 121 and the substrate 31 of the mask 30. Hence, the distortion amount of the partial mask is determined in advance, the incident angle is set so that the changing amount of the applied position according to the incident angle is equivalent and in the compensating direction to the distortion amount, and the distortion of the partial mask can be thus corrected.

The smaller electron beam scanning the partial mask can theoretically correct any distortion; however, it is preferable that the electron beam has a certain size to satisfy the throughput, and in such a case, a rather large distortion cannot be corrected. Also, although the distortion can be corrected even if it is non-linear, an example is described where the correction is performed while approximating the distortion to be linear as shown in FIG. 12 in order to simplify the control of the subsidiary deflecting device.

As illustrated in FIG. 12, points P1–P4 are respectively exposed at desired positions while the partial mask is exposed. However, as a result of forming holes corresponding to the apertures and processing of the film portion, suppose that the points P1, P2, P3 and P4 have been formed at the points P1', P2', P3' and P4', respectively, in the partial mask that has been actually manufactured. This is considered as the original ideal XY coordinates are linear-transformed into actually distorted xy coordinates. In order to correct the distorted xy coordinates to the original ideal XY coordinates, a linear transformation is performed by the following transformational functions:

$$X = a_1 + a_2 \cdot x + a_3 \cdot y + a_4 \cdot xy;$$

and $$Y = b_1 + b_2 \cdot x + b_3 \cdot y + b_4 \cdot xy,$$

where $a_1$–$a_4$ and $b_1$–$b_4$ are correction factors for the partial mask's distortion.

The correction factors $a_1$–$a_4$ and $b_1$–$b_4$ are obtained by substituting the coordinates of P1'–P4' and the coordinates of P1–P4 into the above transformational functions.

The incident angle is determined according to the correction amount at each point on the mask that is calculated from the above transformational functions, the deflecting amount of the subsidiary deflector is determined, and the exposure is then performed, so that the pattern without distortion can be exposed on the substrate 31 of the mask 30 even if the partial mask has been distorted.

Figure 5:
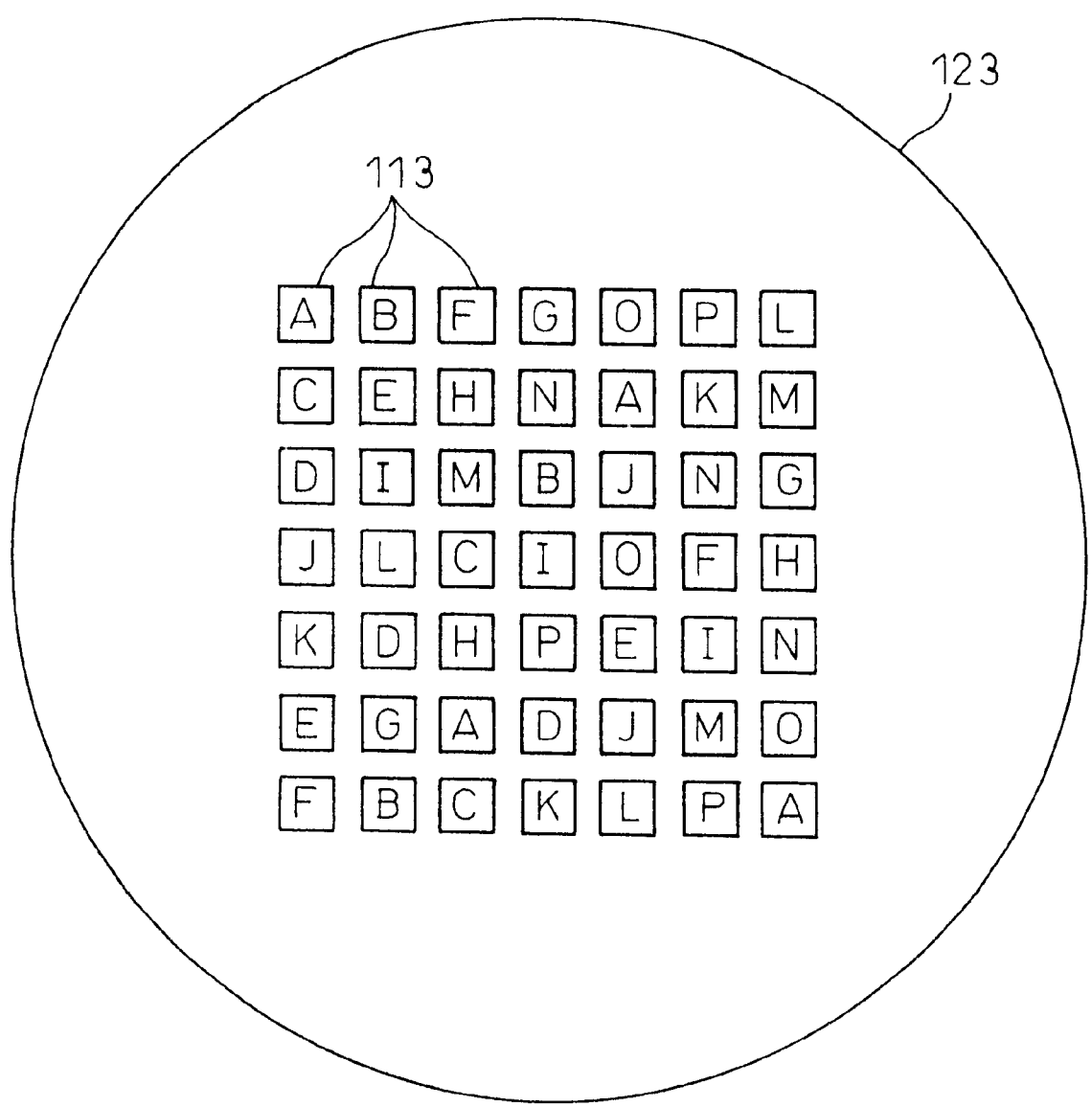
FIG. 5 is a view showing an arrangement of partial masks on a partial mask substrate according to the second embodiment of the present invention.

The first embodiment is an example where sixteen partial masks into which one mask is divided are formed on a partial mask substrate; however, it is possible to use the partial mask substrate that can have more partial masks. FIG. 5 is a view showing a configuration of a partial mask substrate according to the second embodiment of the present invention. In the second embodiment, the mask 30 is divided into sixteen partial areas A–P in the same way as the first embodiment. As shown in FIG. 5, forty-nine partial masks 113 are formed on the partial mask substrate 123 according to the second embodiment. Four pieces of the partial mask A and three pieces of each of the other partial masks B–P are formed. In this case, although the exposure time is increased, one set of the defectless partial masks A–P can be obtained on one partial mask substrate in most cases, since an incidence of uncorrectable defects on all four pieces or all three pieces of the same partial mask is low. This embodiment is suitable for a case when there is a high incidence of defect.

A partial mask substrate can have sixteen partial masks in the first embodiment and forty-nine partial masks in the second embodiment; however, a partial mask substrate can have less number of partial masks. A partial mask substrate may have a single partial mask. In this case, although the partial mask substrates have to be changed every exposure time for each of the partial masks, the period of time using an expensive and conventional electron beam exposure apparatus is shortened, and the production costs of the masks are hence reduced.

Figure 6:
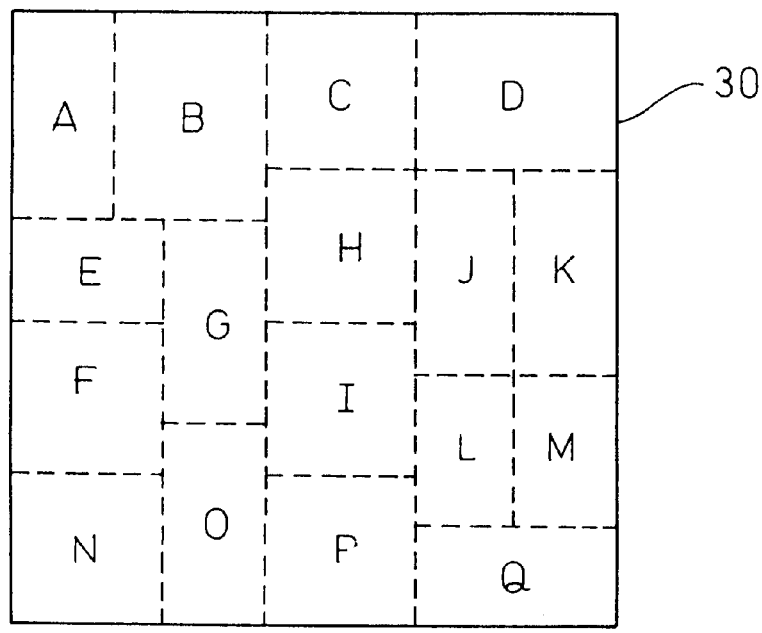
FIG. 6 is a view showing another example of dividing a mask into partial mask areas.

Furthermore, although the mask is divided into a number of partial areas that have almost identical shapes in the first and second embodiments, the partial areas can have any shape. For example, the mask can be divided into areas A–Q as shown in FIG. 6. At each boundary of the areas, the areas are divided in accordance with the patterns so as to be easily connected with each other.

Figure 7:
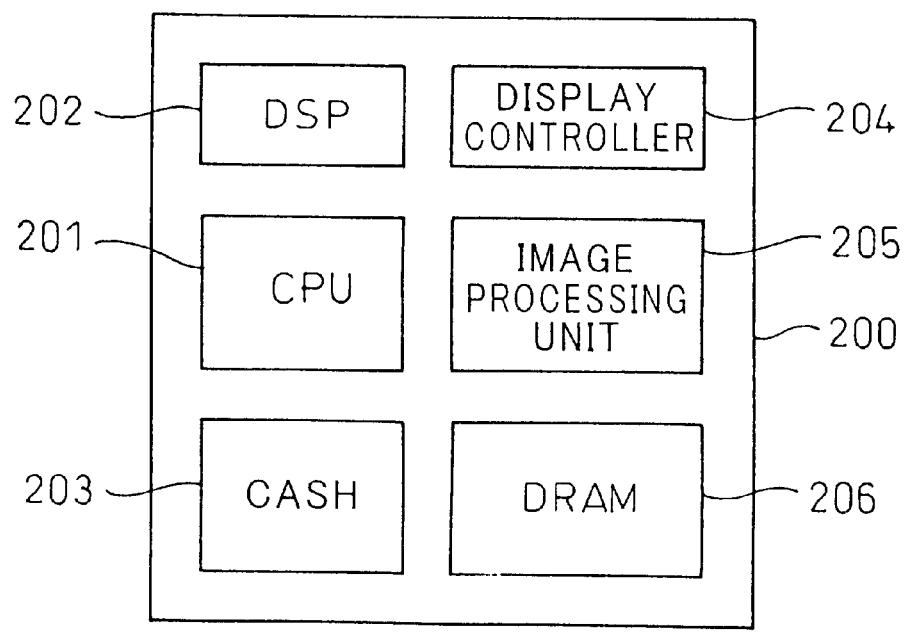
FIG. 7 is a view showing an example of a customized semiconductor chip.

Conventionally, a plurality of general semiconductor chips are assembled to make a circuit device having a desired function. In contrast, in order to make a circuit apparatus compact in size and saving electricity, customization is advanced so that one semiconductor chip includes variety kinds of functional circuits. FIG. 7 shows an example of a customized semiconductor chip 200, into which a CPU 201, a DSP 202, a cash memory 203, a display controller 204, an image processing unit 205 and a DRAM 206 are integrated. By such configuration, the device can be compact in size and save electricity. However, a production amount of such customized device is generally a little. When one kind of chips are manufactured, the larger the production amount of the chips, the less the cost of the mask per chip. Then, a small production amount of customized semiconductor chips causes a serious problem of the mask's cost. In the third embodiment, an example is given about the method of manufacturing the mask that is suitable for such customized semiconductor chips.

Figure 9:
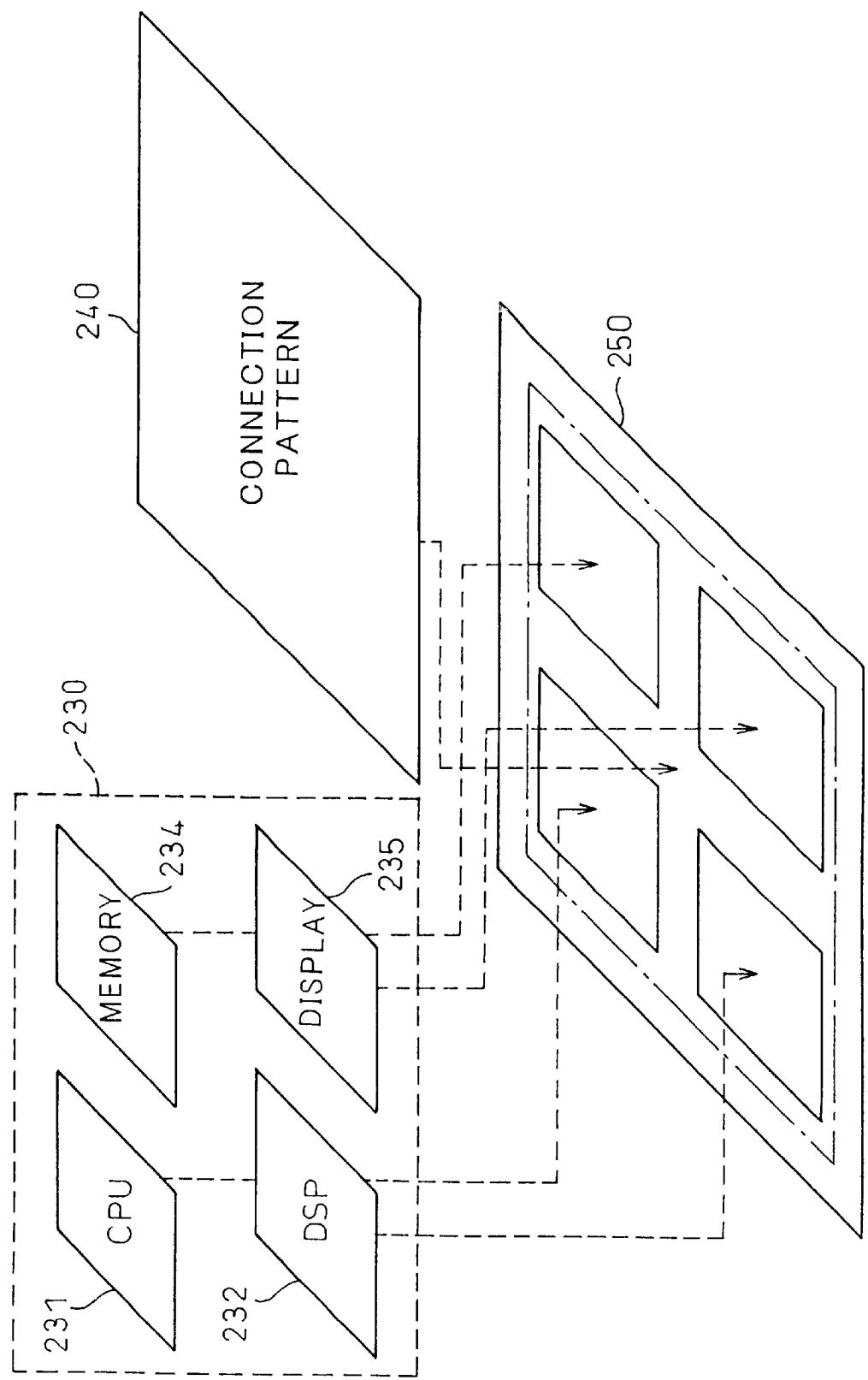
FIG. 9 is a diagram illustrating an exposure of the mask according to the third embodiment.

To generally design the customized semiconductor chip, fundamental circuits that are suitable for an objective circuit device are selected from a library that contains design data for fundamental circuit groups classified by functions such as the CPU, the DSP, the DRAM, the SRAM, the flush memory, the image processing circuit, the display controller, and the analog circuit. Then, the selected fundamental circuits are integrated. According to the third embodiment of the present invention, the masks are provided in advance according to the design data for the fundamental circuit groups classified by their functions. For example, as shown in FIG. 8, a CPU mask group 211, a DSP mask group 212, a DRAM mask group 216, an SRAM mask group 217, an image processing mask group 215, and a display controller mask group 214 are provided. Then, as shown in FIG. 9, according to the circuits to be integrated, a mask set 230, which includes the CPU 231, the DSP 232, the memory 234 and the display 235, is selected from the provided mask groups. Further, a connection pattern 240 that is required for connecting the patterns of the masks in the mask set 230 is separately provided. Then, these patterns are unitedly exposed so that a pattern for the objective circuit device is exposed, and the mask 250 is thus formed. In view of the above method, the connection pattern 240 is only required to be newly formed, which extremely shorten a lead time of manufacturing the mask 250.

In this case, since the electron beam proximity exposure apparatus is also used for exposing the patterns of the masks in the mask set 230 and the connection pattern 240, a period of time for exposure can be extremely shortened compared to a period of time for exposing all patterns of the mask 250 by the conventional electron beam exposure apparatus.

When the connection pattern 240 is nut many, the patterns of the masks in the mask set 230 are exposed by the electron beam proximity exposure apparatus, and the connection pattern 240 can be exposed by the conventional electron beam exposure apparatus. Even in such a case, since the patterns for great portions are exposed by the electron beam proximity exposure apparatus, the period of time for exposing is extremely shortened compared to the case that all patterns are exposed by the conventional electron beam exposure apparatus.

As described in the above, according to the present invention, the masks to be used in the electron beam proximity exposure apparatus can be manufactured by reduced costs and a short lead time.

It should be understood, however, that there is no intention to limit the invention to the specific forms disclosed, but on the contrary, the invention is to cover all modifications, alternate constructions and equivalents falling within the spirit and scope of the invention as expressed in the appended claims.

What is claimed is:

1. A method for manufacturing a mask which is used in an electron beam proximity exposure apparatus comprising an electron beam source which emits a collimated electron beam, the mask having an aperture which is arranged on a path of the electron beam, and a stage which holds and moves an object, wherein the mask is arranged in proximity to a surface of the object and a pattern corresponding to the aperture of the mask is exposed on the surface of the object with the electron beam having passed through the aperture, the method comprising the steps of:

dividing the mask into a plurality of partial areas, and forming a plurality of partial masks which have apertures with patterns identical with the plurality of partial areas, respectively; and manufacturing the mask by exposing the patterns of the plurality of partial masks on corresponding positions of a mask substrate in an electron beam proximity exposure method.

2. The method as defined in claim 1, wherein each of the plurality of partial masks has a positioning mark.

3. The method as defined in claim 1, wherein:

distortion of the plurality of partial masks with respect to desired patterns is determined after the forming thereof: and when each of the patterns of the plurality of partial masks is exposed, an application direction of the electron beam is changed so as to correct the determined distortion.

4. The method as defined in claim 1, wherein the step of forming the plurality of partial masks comprises:

a first step of forming the plurality of partial masks separately from each other on a single partial mask substrate;

a second step of inspecting each of the plurality of partial masks concerning defect;

a third step of correcting a correctable defect of each of the plurality of partial masks;

a fourth step of forming, on a subsidiary partial mask substrate, a partial mask having a pattern which a partial mask having an uncorrectable defect among the plurality of partial masks should have had;

a fifth step of inspecting the partial mask formed on the subsidiary partial mask substrate concerning defect; and a sixth step of correcting a correctable defect of each partial mask formed on the subsidiary partial mask substrate, wherein if the plurality of partial masks without defect are obtained corresponding to all of the plurality of partial areas of the mask in the third step, the step of forming the plurality of partial masks is terminated, wherein if the plurality of partial masks without defect are not obtained corresponding to all of the plurality of partial areas of the mask in the third step, the fourth step through the sixth step are repeated until the plurality of partial masks without defect are obtained corresponding to all of the plurality of partial areas of the mask.

5. The method as defined in claim 4, wherein in the first step, the plurality of partial masks are formed on the partial mask substrate corresponding to all of the plurality of partial areas of the mask, and at least one partial mask is further formed on the partial mask substrate corresponding to at least one of the plurality of partial areas of the mask.

6. The method as defined in claim 4, wherein in the fourth step, partial masks concerning the uncorrectable defect are formed as many as possible on the subsidiary partial mask substrate.

7. A mask manufactured in accordance with the method of claim 1.

8. A mask manufactured in accordance with the method of claim 2.

9. A mask manufactured in accordance with the method of claim 3.

10. A mask manufactured in accordance with the method of claim 4.

11. A mask manufactured in accordance with the method of claim 5.

12. A mask manufactured in accordance with the method of claim 6.

* * * * *